United States Patent
Chen et al.

(10) Patent No.: US 10,177,203 B2
(45) Date of Patent: Jan. 8, 2019

(54) PIXEL STRUCTURE AND MANUFACTURING METHOD FOR THE SAME

(71) Applicant: WUHAN CHINA STAR OPTOELECTRONICS TECHNOLOGY CO., LTD., Wuhan (CN)

(72) Inventors: Yung Sheng Chen, Wuhan (CN); Hsiang Lun Hsu, Wuhan (CN)

(73) Assignee: WUHAN CHINA STAR OPTOELECTRONICS TECHNOLOGY CO., LTD, Wuhan (CN)

(*) Notice: Subject to any disclaimer, the term of this patent is extended or adjusted under 35 U.S.C. 154(b) by 83 days.

(21) Appl. No.: 15/313,999

(22) PCT Filed: Sep. 9, 2016

(86) PCT No.: PCT/CN2016/098561
§ 371 (c)(1),
(2) Date: Nov. 25, 2016

(87) PCT Pub. No.: WO2018/035894
PCT Pub. Date: Mar. 1, 2018

(65) Prior Publication Data
US 2018/0182826 A1   Jun. 28, 2018

(30) Foreign Application Priority Data

Aug. 23, 2016 (CN) .......................... 2016 1 0708340

(51) Int. Cl.
*H01L 27/32* (2006.01)
*H01L 21/84* (2006.01)
(Continued)

(52) U.S. Cl.
CPC .......... *H01L 27/3218* (2013.01); *H01L 21/84* (2013.01); *H01L 27/12* (2013.01);
(Continued)

(58) Field of Classification Search
CPC ............. H01L 27/3218; H01L 27/3213; H01L 51/0011; H01L 51/0005; H01L 51/001; H01L 51/504
See application file for complete search history.

(56) References Cited

U.S. PATENT DOCUMENTS

2004/0135495 A1*  7/2004  Wu ........................ C09K 11/06
                                                 313/503
2009/0267494 A1* 10/2009  Lee ..................... H01L 51/5265
                                                 313/504
2011/0310461 A1   12/2011  Bouchard
(Continued)

FOREIGN PATENT DOCUMENTS

CN       102540548 A    7/2012
CN       102625112 A    8/2012
(Continued)

*Primary Examiner* — Joseph Galvin, III
(74) *Attorney, Agent, or Firm* — Muncy, Geissler, Olds & Lowe, P.C.

(57) ABSTRACT

A pixel structure and manufacturing method thereof are provided. The pixel structure includes: a substrate; an anode electrode layer disposed on the substrate; a plurality of pixel units disposed on the anode electrode layer in rectangular array, where each of the pixel units includes four sub-pixel units arranged in rectangular array, and the emitting colors of the two opposite sub-pixel units at the opposite sides of any two adjacent pixel units are the same; and a cathode electrode layer disposed on the pixel units.

5 Claims, 2 Drawing Sheets

(51) Int. Cl.
  *H01L 27/12* (2006.01)
  *H01L 29/06* (2006.01)
  *H01L 51/00* (2006.01)
  *H01L 51/50* (2006.01)
(52) U.S. Cl.
  CPC .......... *H01L 29/06* (2013.01); *H01L 51/0011* (2013.01); *H01L 27/3213* (2013.01); *H01L 51/001* (2013.01); *H01L 51/0005* (2013.01); *H01L 51/504* (2013.01)

(56) References Cited

U.S. PATENT DOCUMENTS

| | | | | |
|---|---|---|---|---|
| 2013/0112960 | A1* | 5/2013 | Chaji | ............... H01L 51/50 257/40 |
| 2014/0183499 | A1* | 7/2014 | Kim | ............... H01L 27/3213 257/40 |
| 2014/0284570 | A1 | 9/2014 | Jinta et al. | |
| 2015/0287763 | A1 | 10/2015 | Huang et al. | |
| 2016/0013252 | A1* | 1/2016 | Wang | ............... H01L 27/3213 345/206 |
| 2016/0027841 | A1 | 1/2016 | Harada | |
| 2016/0240590 | A1 | 8/2016 | Liu et al. | |
| 2016/0268351 | A1* | 9/2016 | Wu | ............... H01L 27/3209 |
| 2017/0194389 | A1 | 7/2017 | Guo et al. | |

FOREIGN PATENT DOCUMENTS

| | | |
|---|---|---|
| CN | 103762224 A | 4/2014 |
| CN | 103792724 A | 5/2014 |
| CN | 103824875 A | 5/2014 |
| CN | 104051672 A | 9/2014 |
| CN | 104916661 A | 9/2015 |
| CN | 104977637 A | 10/2015 |
| JP | 2014186258 A | 10/2014 |

* cited by examiner

PIXEL STRUCTURE AND MANUFACTURING METHOD FOR THE SAME

BACKGROUND OF THE INVENTION

1. Field of the Invention

The present invention relates to a field of display technology, and more specifically to a pixel structure and a manufacturing method for the same.

2. Description of the Prior Art

The arrangement of an existing RGB side-by-side pixel design is using a RGB layout or an S-stripe layout. The arrangement will lead to a resolution limitation by a fine metal mask process, and thus prevent the increase of the resolution of a display screen.

Therefore, the disadvantages in the prior art need to be improved.

SUMMARY OF THE INVENTION

An object of the present invention is to provide a pixel structure and a manufacturing method for the same, thereby solving the disadvantages of the low resolution of an existing pixel structure.

To overcome the above-mentioned disadvantages, the present invention provides a pixel structure including:
a substrate;
an anode electrode layer disposed on the substrate;
a plurality of pixel units disposed on the anode electrode layer in rectangular array, in which each of the pixel units includes four sub-pixel units arranged in rectangular array, and the emitting colors of the two opposite sub-pixel units at the opposite sides of any two adjacent pixel units are the same; and
a cathode electrode layer disposed on the pixel units.

In the pixel structure of the present invention, each of the pixel units includes a red sub-pixel unit, a green sub-pixel unit, a blue sub-pixel unit, and a white sub-pixel unit.

In the pixel structure of the present invention, a hole transport layer, a hole injection layer, an electron transport layer, and an electron injection layer are further included. Each of the pixel units, the hole transport layer, the hole injection layer, and the anode electrode layer are stacked-up in sequence. The cathode electrode layer, the electron injection layer, the electron transport layer, and each of the pixel units are stacked-up in sequence.

In the pixel structure of the present invention, the red sub-pixel unit includes a yellow emitting layer and a red emitting layer which are sequentially disposed on the hole transport layer, and the white sub-pixel unit includes a blue emitting layer, a yellow emitting layer, and a red emitting layer which are sequentially disposed on the hole transport layer.

The thickness of the each area of the hole transport layer is a predetermined thickness, so that the emitting region of the red sub-pixel unit is in the corresponding red emitting layer, and the emitting region of the white sub-pixel unit is in a border between the corresponding yellow emitting layer and the corresponding blue emitting layer.

In the pixel structure of the present invention, the sub-pixel units are made of electroluminescent materials.

In the pixel structure of the present invention, in each of the pixel units, the red sub-pixel unit is collinear with the white sub-pixel unit, and the blue sub-pixel unit is collinear with the white sub-pixel unit.

The present invention provides a pixel structure including:
a substrate;
an anode electrode layer disposed on the substrate;
a plurality of pixel units disposed on the anode electrode layer in rectangular array, in which each of the pixel units includes four sub-pixel units arranged in rectangular array, and the emitting colors of the two opposite sub-pixel units at the opposite sides of any two adjacent pixel units are the same; and
a cathode electrode layer disposed on the pixel units,
where each of the pixel units includes a red sub-pixel unit, a green sub-pixel unit, a blue sub-pixel unit, and a white sub-pixel unit, and the sub-pixel units are made of electroluminescent materials.

The present invention further provides a method for manufacturing a pixel structure including the following steps of:
forming an anode electrode layer onto a substrate;
forming a hole injection layer onto the anode electrode layer;
forming a hole transport layer onto the hole injection layer;
forming a plurality of pixel units onto the hole transport layer, in which the pixel units are arranged in rectangular array, each of the pixel units includes four sub-pixel units arranged in rectangular array, and the emitting colors of the two opposite sub-pixel units at the opposite sides of any two adjacent pixel units are the same;
forming an electron injection layer onto the pixel units;
forming an electron transport layer onto the electron injection layer; and
forming a cathode electrode layer onto the electron transport layer.

In the method for manufacturing the pixel structure of the present invention, each of the pixel units includes a red sub-pixel unit, a green sub-pixel unit, a blue sub-pixel unit, and a white sub-pixel unit.

In the method for manufacturing the pixel structure of the present invention, the step of forming a plurality of pixel units onto the hole transport layer (in which the pixel units are arranged in rectangular array, and each of the pixel units comprises four sub-pixel units arranged in rectangular array) includes the following steps of:
forming a green emitting layer onto the hole transport layer by a first metal mask;
forming a blue emitting layer onto the hole transport layer positioned at areas of the blue sub-pixel unit and the white sub-pixel unit by a second metal mask;
forming a yellow emitting layer onto the hole transport layer positioned at an area of the red sub-pixel unit and onto the blue emitting layer in the white sub-pixel unit by a third metal mask; and
forming a red emitting layer onto the yellow emitting layer in the red sub-pixel unit and onto the yellow emitting layer in the white sub-pixel unit by the third metal mask,
where the thickness of the each area of the hole transport layer is a predetermined thickness, so that the emitting region of the red sub-pixel unit is in the corresponding red emitting layer, and the emitting region of the white sub-pixel unit is in a border between the corresponding yellow emitting layer and the corresponding blue emitting layer.

In the method for manufacturing the pixel structure of the present invention, in each of the pixel units, the red sub-pixel unit is collinear with the white sub-pixel unit, and the blue sub-pixel unit is collinear with the white sub-pixel unit.

In comparison to the prior art, in the pixel structure of the preferred embodiment of the present invention, since each of the pixel units includes four sub-pixel units arranged in rectangular array, and the emitting colors of the two opposite sub-pixel units at the opposite sides of any two adjacent pixel units are the same, therefore, one sub-pixel unit of at least four pixel units can share one mask opening when the pixel units are formed by a metal mask, and the purposes of the increase of the process capability of the metal mask and the increase of the resolution of a display screen can be achieved.

The above objectives, and other objectives, features, advantages, and embodiments of the present invention will be better understood from the following description being considered in connection with the accompanied drawings and in which a preferred embodiment of the invention is illustrated by way of example.

DETAILED DESCRIPTION OF THE PREFERRED EMBODIMENTS

Figure 1:
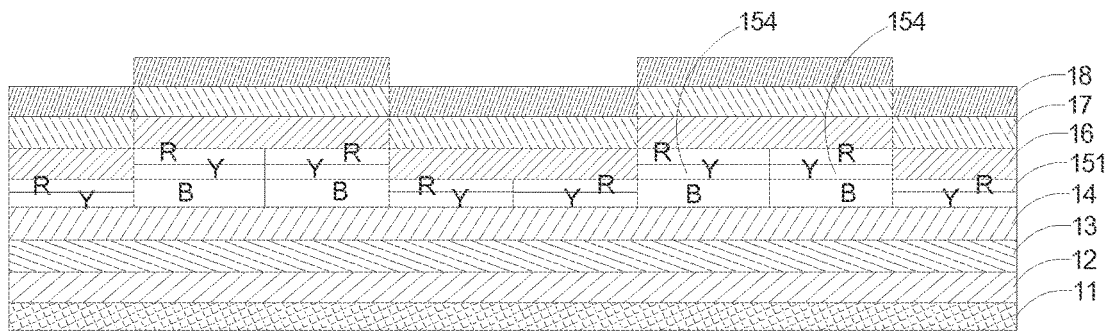
FIG. 1 is a schematic view of a structure of a pixel structure according to a preferred embodiment of the present invention.

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", "left", "right", "inside", "outside", "side", etc., is used with reference to the orientation of the figure(s) being described. As such, the directional terminology is used for purposes of illustration and is in no way limiting.

Throughout this specification and in the drawings like parts will be referred to by the same reference numerals.

Figure 2:
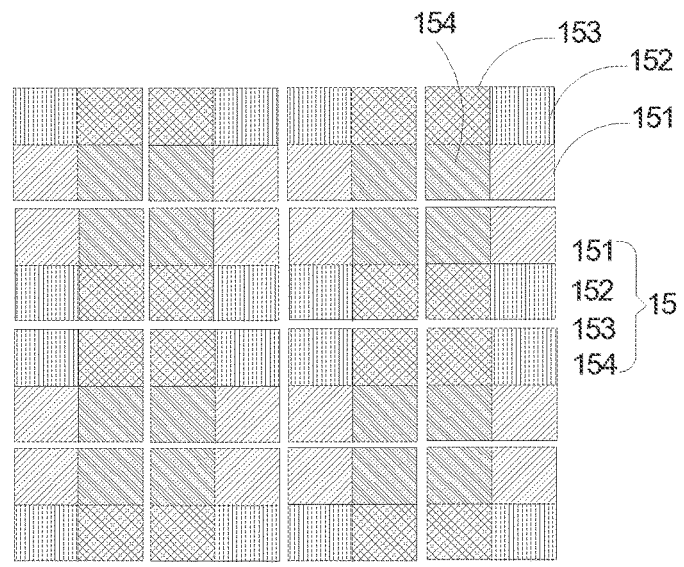
FIG. 2 is a schematic view of the distribution of the sub-pixel units of the pixel structure of the embodiment of FIG. 1 of the present invention.

Please refer to FIGS. 1 and 2. The pixel structure of the preferred embodiment of the present invention includes a substrate 11, an anode electrode layer 12, a hole injection layer 13, a hole transport layer 14, a plurality of pixel units 15, an electron transport layer 16, an electron injection layer 17, and a cathode electrode layer 18.

The anode electrode layer 12 is formed on the substrate 11 by an evaporation process. The hole injection layer 13 is formed on the anode electrode layer 12 by an evaporation process. The hole transport layer 14 is formed on the hole injection layer 13 by an evaporation process. The pixel units 15 are disposed on the hole transport layer 14. The electron transport layer 16 is formed on the pixel units 15 by an evaporation process. The electron injection layer 17 is formed on the electron transport layer 16 by an evaporation process. The cathode electrode layer 18 is formed on the electron injection layer 17 by an evaporation process. Each of the pixel units 15 includes four sub-pixel units arranged in rectangular array. The emitting colors of the two opposite sub-pixel units at the opposite sides of any two adjacent pixel units 15 are the same.

Specifically, each of the pixel units 15 includes a red sub-pixel unit 151, a green sub-pixel unit 152, a blue sub-pixel unit 153, and a white sub-pixel unit 154.

The red sub-pixel unit 151 includes a yellow emitting layer Y and a red emitting layer R which are sequentially disposed on the hole transport layer 14. The white sub-pixel unit 154 includes a blue emitting layer B, a yellow emitting layer Y, and a red emitting layer R which are sequentially disposed on the hole transport layer 14. The green sub-pixel unit 152 includes a green emitting layer G. The blue sub-pixel unit 153 includes a blue emitting layer B. In the present embodiment, the emitting region of the red sub-pixel unit 151 is in the corresponding red emitting layer R by controlling the thickness of the each area of the hole transport layer 14 as a predetermined thickness to emit a red light, and the emitting region of the white sub-pixel unit 154 is in a border between the corresponding yellow emitting layer Y and the corresponding blue emitting layer B by controlling the thickness of the each area of the hole transport layer 14 as the predetermined thickness to emit a white light.

The red sub-pixel unit 151, the green sub-pixel unit 152, the blue sub-pixel unit 153, and the white sub-pixel unit 154 are made of electroluminescent materials. When in use, a hole and an electron generated by the anode electrode 12 and the cathode electrode 18 are combined as an exciton in each of the sub-pixel units. The energy of the exciton is transferred to a luminescent molecule, so that an electron in the luminescent molecule is excited to an excited state. The excited state is an unstable state, and then a visible light is generated by a de-excitation. Also, the injection capacity of the hole and the electron is increased by the hole injection layer 13 and the electron injection layer 17, and the transport capacity of the hole and the electron is increased by the hole transport layer 14 and the electron transport layer 16.

Further, in each of the pixel units 15, the red sub-pixel unit 151 is collinear with the white sub-pixel unit 154, and the blue sub-pixel unit 153 is collinear with the white sub-pixel unit 154. The number of the sub-pixel units which shares one opening of one metal mask can be further increased in this way.

As mentioned above, in the pixel structure of the preferred embodiment of the present invention, since each of the pixel units 15 includes four sub-pixel units arranged in rectangular array, and the emitting colors of the two opposite sub-pixel units at the opposite sides of any two adjacent pixel units are the same, therefore, one sub-pixel unit of at least four pixel units can share one mask opening when the pixel units are formed by a metal mask, and the purposes of the increase of the process capability of the metal mask and the increase of the resolution of the pixel units can be achieved.

Further, since the red sub-pixel unit 151 includes the yellow emitting layer Y and the red emitting layer R which are sequentially disposed on the hole transport layer 14, the white sub-pixel unit 154 includes the blue emitting layer B, the yellow emitting layer Y, and the red emitting layer R which are sequentially disposed on the hole transport layer 14, and by controlling the thickness of the each area of the hole transport layer 14 as the predetermined thickness, therefore, the emitting region of the red sub-pixel unit 151 is in the corresponding red emitting layer R to emit a red light, and the emitting region of the white sub-pixel unit 154 is in the border between the corresponding yellow emitting layer Y and the corresponding blue emitting layer B to emit a white light. Therefore, the red sub-pixel unit 151 and the white sub-pixel unit 154 can be manufactured by one metal mask in the manufacturing process, and that has a beneficial effect of the reduction of masks.

Figure 3:
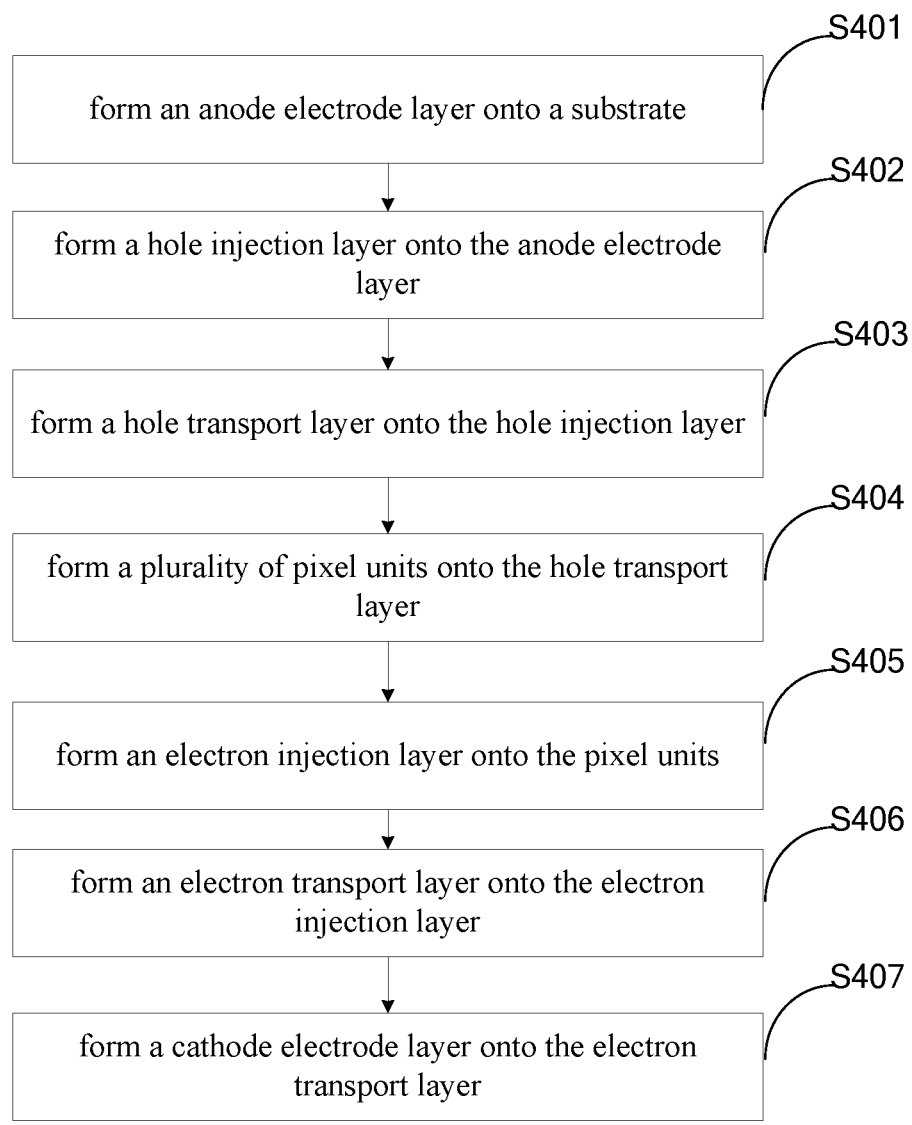
FIG. 3 is a flow chart of a method according to a preferred embodiment of the present invention for manufacturing a pixel structure.

FIG. 3 is a flow chart of a method according to a preferred embodiment of the present invention for manufacturing a pixel structure. The method includes the following steps of:

step S401: forming an anode electrode layer onto a substrate;

step S402: forming a hole injection layer onto the anode electrode layer;

step S403: forming a hole transport layer onto the hole injection layer;

step S404: forming a plurality of pixel units onto the hole transport layer, in which the pixel units are arranged in rectangular array, each of the pixel units includes four sub-pixel units arranged in rectangular array, and the emitting colors of the two opposite sub-pixel units at the opposite sides of any two adjacent pixel units are the same;

step S405: forming an electron injection layer onto the pixel units;

step S406: forming an electron transport layer onto the electron injection layer; and step S407: forming a cathode electrode layer onto the electron transport layer.

Please refer to FIGS. 1 and 2. Each of the steps of the method for manufacturing the pixel structure will now be described.

In step S401, the anode electrode layer 12 is formed on the substrate 11 by an evaporation process.

In step S402, the hole injection layer 13 is formed on the anode electrode layer 12 by an evaporation process.

In step S403, the hole transport layer 14 is formed on the hole injection layer 13 by an evaporation process.

In step S404, each of the pixel units 15 includes a red sub-pixel unit 151, a green sub-pixel unit 152, a blue sub-pixel unit 153, and a white sub-pixel unit 154.

The red sub-pixel unit 151 includes a yellow emitting layer Y and a red emitting layer R which are sequentially disposed on the hole transport layer 14. The white sub-pixel unit 154 includes a blue emitting layer B, a yellow emitting layer Y, and a red emitting layer R which are sequentially disposed on the hole transport layer 14. The green sub-pixel unit 152 includes a green emitting layer G. The blue sub-pixel unit 153 includes a blue emitting layer B. Therefore, the step S404 specifically includes the following sub-steps of:

step S100: forming a green emitting layer onto the hole transport layer by a first metal mask;

step S200: forming a blue emitting layer onto the hole transport layer positioned at areas of the blue sub-pixel unit and the white sub-pixel unit by a second metal mask;

step S300: forming a yellow emitting layer onto the hole transport layer positioned at an area of the red sub-pixel unit and onto the blue emitting layer in the white sub-pixel unit by a third metal mask; and step S400: faulting a red emitting layer onto the yellow emitting layer in the red sub-pixel unit and onto the yellow emitting layer in the white sub-pixel unit by the third metal mask.

The thickness of the each area of the hole transport layer 14 is a predetermined thickness, so that the emitting region of the red sub-pixel unit 151 is in the corresponding red emitting layer R, and the emitting region of the white sub-pixel unit 154 is in a border between the corresponding yellow emitting layer Y and the corresponding blue emitting layer B.

In step S100, an evaporation process or an inkjet printing process can be employed when the green emitting layer G is formed.

In step S200, an evaporation process or an inkjet printing process can be employed when the blue emitting layer B is formed.

In step S300, an evaporation process or an inkjet printing process can be employed when the yellow emitting layer Y is formed.

In step S400, an evaporation process or an inkjet printing process can be employed when the red emitting layer R is formed.

Further, in each of the pixel units 15, the red sub-pixel unit 151 is collinear with the white sub-pixel unit 154, and the blue sub-pixel unit 153 is collinear with the white sub-pixel unit 154.

As mentioned above, in the method for manufacturing the pixel structure of the preferred embodiment of the present invention, since each of the pixel units 15 includes four sub-pixel units arranged in rectangular array, and the emitting colors of the two opposite sub-pixel units at the opposite sides of any two adjacent pixel units are the same, therefore, one sub-pixel unit of at least four pixel units can share one mask opening when the pixel units are formed by a metal mask, and the purposes of the increase of the process capability of the metal mask and the increase of the resolution of the pixel units can be achieved.

Further, since the red sub-pixel unit 151 includes the yellow emitting layer Y and the red emitting layer R which are sequentially disposed on the hole transport layer 14, the white sub-pixel unit 154 includes the blue emitting layer B, the yellow emitting layer Y, and the red emitting layer R which are sequentially disposed on the hole transport layer 14, and by controlling the thickness of the each area of the hole transport layer 14 as the predetermined thickness, therefore, the emitting region of the red sub-pixel unit 151 is in the corresponding red emitting layer R to emit a red light, and the emitting region of the white sub-pixel unit 154 is in the border between the corresponding yellow emitting layer Y and the corresponding blue emitting layer B to emit a white light. Therefore, the red sub-pixel unit 151 and the white sub-pixel unit 154 can be manufactured by one metal mask in the manufacturing process, and that has a beneficial effect of the reduction of masks.

It should be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A pixel structure, comprising:
a substrate;
an anode electrode layer disposed on the substrate;
a plurality of pixel units disposed on the anode electrode layer in rectangular array, wherein each of the pixel units comprises four sub-pixel units arranged in rectangular array, and emitting colors of the two opposite sub-pixel units at opposite sides of any two adjacent pixel units are the same, wherein each of the pixel units comprises a red sub-pixel unit, a green sub-pixel unit, a blue sub-pixel unit, and a white sub-pixel unit;

a cathode electrode layer disposed on the pixel units; and a hole transport layer, a hole injection layer, an electron transport layer, and an electron injection layer; each of the pixel units, the hole transport layer, the hole injection layer, and the anode electrode layer are stacked in sequence; and the cathode electrode layer, the electron injection layer, the electron transport layer, and each of the pixel units are stacked in sequence, wherein the red sub-pixel unit comprises a yellow emitting layer and a red emitting layer which are sequentially disposed on the hole transport layer; the white sub-pixel unit comprises a blue emitting layer, a yellow emitting layer, and a red emitting layer which are sequentially disposed on the hole transport layer; a thickness of each area of the hole transport layer is a predetermined thickness, so that an emitting region of the red sub-pixel unit is in the corresponding red emitting layer, and an emitting region of the white sub-pixel unit is in a border between the corresponding yellow emitting layer and the corresponding blue emitting layer.

2. The pixel structure of claim 1, wherein in each of the pixel units, the red sub-pixel unit is collinear with the white sub-pixel unit, and the blue sub-pixel unit is collinear with the white sub-pixel unit.

3. The pixel structure of claim 1, wherein the sub-pixel units are made of electroluminescent materials.

4. A method for manufacturing a pixel structure, comprising the following steps of:

forming an anode electrode layer onto a substrate;

forming a hole injection layer onto the anode electrode layer;

forming a hole transport layer onto the hole injection layer;

forming a plurality of pixel units onto the hole transport layer, wherein the pixel units are arranged in rectangular array, each of the pixel units comprises four sub-pixel units arranged in rectangular array, and emitting colors of the two opposite sub-pixel units at opposite sides of any two adjacent pixel units are the same, wherein each of the pixel units comprises a red sub-pixel unit, a green sub-pixel unit, a blue sub-pixel unit, and a white sub-pixel unit;

forming an electron injection layer onto the pixel units;

forming an electron transport layer onto the electron injection layer; and forming a cathode electrode layer onto the electron transport layer, wherein the step of forming a plurality of pixel units onto the hole transport layer comprises the following steps of:

forming a green emitting layer onto the hole transport layer by a first metal mask;

forming a blue emitting layer onto the hole transport layer positioned at areas of the blue sub-pixel unit and the white sub-pixel unit by a second metal mask;

forming a yellow emitting layer onto the hole transport layer positioned at an area of the red sub-pixel unit and onto the blue emitting layer in the white sub-pixel unit by a third metal mask; and forming a red emitting layer onto the yellow emitting layer in the red sub-pixel unit and onto the yellow emitting layer in the white sub-pixel unit by the third metal mask, and wherein a thickness of each area of the hole transport layer is a predetermined thickness, so that an emitting region of the red sub-pixel unit is in the corresponding red emitting layer, and an emitting region of the white sub-pixel unit is in a border between the corresponding yellow emitting layer and the corresponding blue emitting layer.

5. The method for manufacturing the pixel structure of claim 4, wherein in each of the pixel units, the red sub-pixel unit is collinear with the white sub-pixel unit, and the blue sub-pixel unit is collinear with the white sub-pixel unit.

* * * * *